(12) United States Patent
Sherry et al.

(10) Patent No.: US 11,002,760 B1
(45) Date of Patent: May 11, 2021

(54) HIGH ISOLATION HOUSING FOR TESTING INTEGRATED CIRCUITS

(71) Applicant: Johnstech International Corporation, Minneapolis, MN (US)

(72) Inventors: Jeffrey Sherry, Savage, MN (US); Dennis Wagner, Minneapolis, MN (US)

(73) Assignee: Johnstech International Corporation

( * ) Notice: Subject to any disclaimer, the term of this patent is extended or adjusted under 35 U.S.C. 154(b) by 259 days.

(21) Appl. No.: 15/889,623

(22) Filed: Feb. 6, 2018

Related U.S. Application Data

(60) Provisional application No. 62/562,769, filed on Sep. 25, 2017, provisional application No. 62/455,042, filed on Feb. 6, 2017.

(51) Int. Cl.
*G01R 1/04* (2006.01)
*G01R 3/00* (2006.01)
*G01R 31/28* (2006.01)

(52) U.S. Cl.
CPC .............. *G01R 1/045* (2013.01); *G01R 3/00* (2013.01); *G01R 31/2874* (2013.01)

(58) Field of Classification Search
CPC ........ G01R 1/045; G01R 3/00; G01R 31/2874
See application file for complete search history.

(56) References Cited

U.S. PATENT DOCUMENTS

| | | | |
|---|---|---|---|
| 3,493,858 A | 2/1970 | Baron et al. | |
| 5,302,853 A | 4/1994 | Volz et al. | |
| 5,306,167 A | 4/1994 | Nagumo | |
| 5,410,258 A | 4/1995 | Bowers et al. | |
| 5,451,165 A | 9/1995 | Cearley-Cabbiness et al. | |
| 5,742,171 A | 4/1998 | Matsunaga et al. | |
| 6,093,030 A * | 7/2000 | Riechelmann | G01R 1/0466 324/750.25 |
| 6,150,616 A * | 11/2000 | Kazama | G01R 1/06733 174/267 |
| 6,340,895 B1 | 1/2002 | Uher et al. | |
| 6,350,138 B1 | 2/2002 | Sinclair | |
| 6,369,594 B1 | 4/2002 | Sinclair | |
| 6,686,657 B1 | 2/2004 | Sinclair | |
| 7,090,522 B2 | 8/2006 | Sinclair | |
| 7,210,951 B2 | 5/2007 | Sinclair | |
| 7,871,283 B2 | 1/2011 | Murakoshi | |
| 8,912,970 B1 * | 12/2014 | Manry, Jr. | H01Q 13/18 343/700 MS |

(Continued)

*Primary Examiner* — Tung X Nguyen
*Assistant Examiner* — Feba Pothen
(74) *Attorney, Agent, or Firm* — Hamre, Schumann, Mueller & Larson, P.C.

(57) ABSTRACT

A system and method for reducing inductance and capacitance and shielding signals in an integrated circuit test for devices under test (DUT) is disclosed. Inductance and capacitance are reduced in two ways. First, by recessing the contact pin housing 22 directly into the load board 20 thereby eliminating much of distance between the load board and DUT. Second, surrounding the slot/well 50 in which each RF contact pin resides in the housing with a ground isolation cage 46, 46a, 48, 47 of electrically conductive strips or rings at the top and bottom of the housing adjacent the slot with connecting vias thereby creating an isolation cage against RF cross talk transmission and further lowering inductance and capacitance.

11 Claims, 23 Drawing Sheets

(56) References Cited

U.S. PATENT DOCUMENTS

| | | | |
|---|---|---|---|
| 2004/0201390 A1* | 10/2004 | Farnworth | G01R 1/0466 |
| | | | 324/754.08 |
| 2007/0236236 A1 | 10/2007 | Shell | |
| 2010/0255690 A1* | 10/2010 | Waite | G01R 1/06772 |
| | | | 439/65 |
| 2014/0091824 A1* | 4/2014 | Fledell | H02J 15/00 |
| | | | 324/755.11 |
| 2015/0241474 A1* | 8/2015 | Landa | G01R 31/2851 |
| | | | 324/756.02 |
| 2015/0293147 A1* | 10/2015 | Lee | H01R 12/714 |
| | | | 324/756.02 |
| 2016/0293554 A1* | 10/2016 | Tan | H01L 23/5385 |

* cited by examiner

HIGH ISOLATION HOUSING FOR TESTING INTEGRATED CIRCUITS

BACKGROUND OF THE INVENTION

Field of the Invention

The present disclosure is directed to equipment for testing microcircuits.

Description of Related Art

As microcircuits continually evolve to be smaller and more complex, the test equipment that tests the microcircuits also evolves. There is an ongoing effort to improve microcircuit test equipment, with improvements leading to an increase in reliability, an increase in throughput, and/or a decrease in expense.

Mounting a defective microcircuit on a circuit board is relatively costly. Installation usually involves soldering the microcircuit onto the circuit board. Once mounted on a circuit board, removing a microcircuit is problematic because the very act of melting the solder for a second time ruins the circuit board. Thus, if the microcircuit is defective, the circuit board itself is probably ruined as well, meaning that the entire value added to the circuit board at that point is lost. For all these reasons, a microcircuit is usually tested before installation on a circuit board.

Each microcircuit must be tested in a way that identifies all defective devices, but yet does not improperly identify good devices as defective. Either kind of error, if frequent, adds substantial overall cost to the circuit board manufacturing process, and can add retest costs for devices improperly identified as defective devices.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacings between them, even small errors in making the contact will result in incorrect connections. Connections to the microcircuit that are misaligned or otherwise incorrect will cause the test equipment to identify the device under test (DUT) as defective, even though the reason for the failure is the defective electrical connection between the test equipment and the DUT rather than defects in the DUT itself.

A further problem in microcircuit test equipment arises in automated testing. Testing equipment may test 100 devices a minute, or even more. The sheer number of tests cause wear on the tester contacts making electrical connections to the microcircuit terminals during testing. This wear dislodges conductive debris from both the tester contacts and the DUT terminals that contaminates the testing equipment and the DUTs themselves.

The debris eventually results in poor electrical connections during testing and false indications that the DUT is defective. The debris adhering to the microcircuits may result in faulty assembly unless the debris is removed from the microcircuits. Removing debris adds cost and introduces another source of defects in the microcircuits themselves.

Other considerations exist as well. Inexpensive tester contacts that perform well are advantageous. Minimizing the time required to replace them is also desirable, since test equipment is expensive. If the test equipment is off line for extended periods of normal maintenance, the cost of testing an individual microcircuit increases.

Test equipment in current use has an array of test contacts that mimic the pattern of the microcircuit terminal array. The array of test contacts is supported in a structure that precisely maintains the alignment of the contacts relative to each other. An alignment template or board aligns the microcircuit itself with the test contacts. The test contacts and the alignment board are mounted on a load board having conductive pads that make electrical connection to the test contacts. The load board pads are connected to circuit paths that carry the signals and power between the test equipment electronics and the test contacts.

For the electrical tests, it is desired to form a temporary electrical connection between each terminal on the device under test and a corresponding electrical pad on a load board. In general, it is impractical to solder and remove each electrical terminal on the microcircuit being contacted by a corresponding electrical probe on the testbed. Instead of soldering and removing each terminal, the tester may employ a series of electrically conductive pins arranged in a pattern that corresponds to both the terminals on the device under test and the electrical pads on the load board. When the device under test is forced into contact with the tester, the pins complete the circuits between respective device under test contacts and corresponding load board pads. After testing, when the device under test is released, the terminals separate from the pins and the circuits are broken.

The present application is directed to improvements to these pins and housings.

An exemplary microcircuit tester is disclosed in United States Patent Application Publication Number US 2007/0202714 A1, titled "Test contact system for testing integrated circuits with packages having an array of signal and power contacts", invented by Jeffrey C. Sherry, published on Aug. 30, 2007 and incorporated by reference herein in its entirety.

For the tester of '714, a series of microcircuits is tested sequentially, with each microcircuit, or "device under test", being attached to a testbed, tested electrically, and then removed from the testbed. The mechanical and electrical aspects of such a testbed are generally automated, so that the throughput of the testbed may be kept as high as possible.

In '714, a test contact element for making temporary electrical contact with a microcircuit terminal comprises at least one resilient finger projecting from an insulating contact membrane as a cantilevered beam. The finger has on a contact side thereof, a conducting contact pad for contacting the microcircuit terminal. Preferably the test contact element has a plurality of fingers, which may advantageously have a pie-shaped arrangement. In such an arrangement, each finger is defined at least in part by two radially oriented slots in the membrane that mechanically separate each finger from every other finger of the plurality of fingers forming the test contact element.

In '714, a plurality of the test contact elements can form a test contact element array comprising the test contact elements arranged in a predetermined pattern. A plurality of connection vias are arranged in substantially the predetermined pattern of the test contacts elements, with each of said connection vias is aligned with one of the test contact elements. Preferably, an interface membrane supports the plurality of connection vias in the predetermined pattern. Numerous vias can be embedded into the pie pieces away from the device contact area to increase life. Slots separating fingers could be plated to create an I-beam, thereby preventing fingers from deforming, and also increasing life.

The connection vias of '714 may have a cup shape with an open end, with the open end of the cup-shaped via contacting the aligned test contact element. Debris resulting from loading and unloading DUTs from the test equipment can fall through the test contact elements where the cup-shaped vias impound the debris.

The contact and interface membranes of '714 may be used as part of a test receptacle including a load board. The load board has a plurality of connection pads in substantially the predetermined pattern of the test contacts elements. The load board supports the interface membrane with each of the connection pads on the load board substantially aligned with one of the connection vias and in electrical contact therewith.

In '714, the device uses a very thin conductive plate with retention properties that adheres to a very thin non-conductive insulator. The metal portion of the device provides multiple contact points or paths between the contacting I/O and the load board. This can be done either with a plated via hole housing or with plated through hole vias, or bumped surfaces, possibly in combination with springs, that has the first surface making contact with the second surface, i.e., the device I/O. The device I/O may be physically close to the load board, thus improving electrical performance.

One particular type of microcircuit often tested before installation has a package or housing having what is commonly referred to as a ball grid array (BGA) terminal arrangement. A typical BGA package may have the form of a flat rectangular block, with typical sizes ranging from 5 mm to 40 mm on a side and 1 mm thick.

A typical microcircuit has a housing enclosing the actual circuitry. Signal and power (S&P) terminals are on one of the two larger, flat surfaces, of the housing. Typically, terminals occupy most of the area between the surface edges and any spacer or spacers. Note that in some cases, a spacer may be an encapsulated chip or a ground pad.

Each of the terminals may include a small, approximately spherical solder ball that firmly adheres to a lead from the internal circuitry penetrating surface, hence the term "ball grid array." Each terminal and spacer projects a small distance away from the surface, with the terminals projecting farther from the surface than the spacers. During assembly, all terminals are simultaneously melted, and adhere to suitably located conductors previously formed on the circuit board.

The terminals themselves may be quite close to each other. Some have centerline spacings of as little as 0.4 mm, and even relatively widely spaced terminals may still be around 1.5 mm apart. Spacing between adjacent terminals is often referred to as "pitch."

In addition to the factors mentioned above, BGA microcircuit testing involves additional factors.

First, in making the temporary contact with the ball terminals, the tester should not damage the S&P terminal surfaces that contact the circuit board, since such damage may affect the reliability of the solder joint for that terminal.

Second, the testing process is more accurate if the length of the conductors carrying the signals is kept short. An ideal test contact arrangement has short signal paths.

Third, solders commonly in use today for BGA terminals are mainly tin for environmental purposes. Tin-based solder alloys are likely to develop an oxide film on the outer surface that conducts poorly. Older solder alloys include substantial amounts of lead, which do not form oxide films. The test contacts must be able to penetrate the oxide film present.

BGA test contacts currently known and used in the art employ spring pins made up of multiple pieces including a spring, a body and top and bottom plungers.

United States Patent Application Publication No. US 2003/0192181 A1, titled "Method of making an electronic contact" and published on Oct. 16, 2003, shows microelectronic contacts, such as flexible, tab-like, cantilever contacts, which are provided with asperities disposed in a regular pattern. Each asperity has a sharp feature at its tip remote from the surface of the contact. As mating microelectronic elements are engaged with the contacts, a wiping action causes the sharp features of the asperities to scrape the mating element, so as to provide effective electrical interconnection and, optionally, effective metallurgical bonding between the contact and the mating element upon activation of a bonding material.

According to United States Patent Application Publication No. US 2004/0201390 A1, titled "Test interconnect for bumped semiconductor components and method of fabrication" and published on Oct. 14, 2004, an interconnect for testing semiconductor components includes a substrate, and contacts on the substrate for making temporary electrical connections with bumped contacts on the components. Each contact includes a recess and a pattern of leads cantilevered over the recess configured to electrically engage a bumped contact. The leads are adapted to move in a z-direction within the recess to accommodate variations in the height and planarity of the bumped contacts. In addition, the leads can include projections for penetrating the bumped contacts, a non-bonding outer layer for preventing bonding to the bumped contacts, and a curved shape which matches the topography of the bumped contacts. The leads can be formed by forming a patterned metal layer on the substrate, by attaching a polymer substrate with the leads thereon to the substrate, or by etching the substrate to form conductive beams.

Another issue in construction of test system is operating frequency and the need to isolate each pin from its neighbor to prevent crosstalk. This problem is also an issue in high density Devices Under Test (DUT), i.e. IC chips or wafers with many contacts. The contact density necessarily puts the pins in very close proximity and crosstalk is also possible. The worst case is of course, where high density and high frequency signals are to be carried on pins.

BRIEF SUMMARY

The following summary is intended to assist the reader in understanding the full disclosure but is not intended to define the scope of the invention. The scope is determined by the claims and their equivalent elements.

There is disclosed an integrated circuit testing system with reduced inductance and impedance, having any or all of the following elements:
a load board having a recessed area formed therein and a bottom layer, the bottom later including a plurality of electrical traces;
a contactor housing sized to be received directly in said recess, the contactor housing including a plurality of contact pins arranged to receive and align with pads of an integrated circuit device under test (DUT); said contact pins each having an upper end to contact said pads and a lower end to contact said electrical traces; and
wherein said contactor is substantially embedded into said load board to provide a short path from DUT to traces.

There is also disclosed a method of constructing an integrated multi-layer load board and test contactor for testing an integrated circuit device under test (DUT) in order to minimize inductance and capacitance of signals from the DUT having any or all of the following steps in any order:

providing a low profile contactor for holding a plurality of contact pins having an upper end to be aligned with said DUT and a lower end to engage electrical traces on said load board;

providing an area of the load board where in a plurality of upper layers are free of components and electrical traces;

in said area, cutting a recess into a plurality but not all layers of the load board to expose a recess load board layer, the recess being sized to receive a contactor housing therein;

extending electrical traces onto said recess layer in the area defined by said recess; said traces being aligned to contact said lower ends of said pins;

so that signals from the DUT travel through the pins and directly to said load board without intermediary pathways thereby minimizing inductance and capacitance.

There is also disclosed a radio frequency (RF) isolating structure for use in an integrated circuit tester to be mounted on a load board for testing, having any or all of the following elements:

a contactor housing having upper and lower surfaces and at least one slot of predetermined length; the slot having sidewalls on either side of the slot;

a contact pin which moveably extends though the slot with the upper end of the pin configured to engaged an integrated circuit device under test (DUT) and a lower end to engage said load board;

adjacent both sidewalls, an electrical pathway extending at least the length of the slot but spaced therefrom located on both said upper and lower surfaces;

at least one electrical via connector joining said pathway on the upper surface to the lower surface thereby creating an isolation fence which can be connected to a ground source.

There is also disclosed an isolating structure wherein said traces are electrical depositions onto said contactor housing surface.

There is also disclosed an isolating structure wherein said via connector includes a plurality of spaced apart connectors.

There is also disclosed an isolating structure where the spacing of the said spaced apart connectors is configured to create a Faraday cage shield.

There is also disclosed an isolating structure wherein said connector includes a solid wall span of metallic curtain connecting substantially the length of the slot from upper to lower surfaces.

There is also disclosed an isolating structure wherein said electrical pathways include a conducting ring adjacent to and surrounding said slot on the upper surface.

There is also disclosed an isolating structure wherein said electrical pathways include a conducting ring adjacent to and surrounding said slot on the upper and lower surfaces and wherein said at least one via connector includes a plurality of via connectors spaced apart and joining said upper and lower surfaces to create a RF isolation of the slot.

There is also disclosed an isolating structure wherein said slot includes inner sidewalls and where said sidewall are electrically conductive and grounded.

There is also disclosed an isolating structure wherein said electrically conducted sidewalls are covered with a non-conductive material.

There is also disclosed an isolating structure wherein said electrical pathways on said upper surface are configured to be part of a Kelvin test system with said pathways being a sense test contact and wherein said contact pin is configure to be a force test contact.

DETAILED DESCRIPTION

Figure 1:
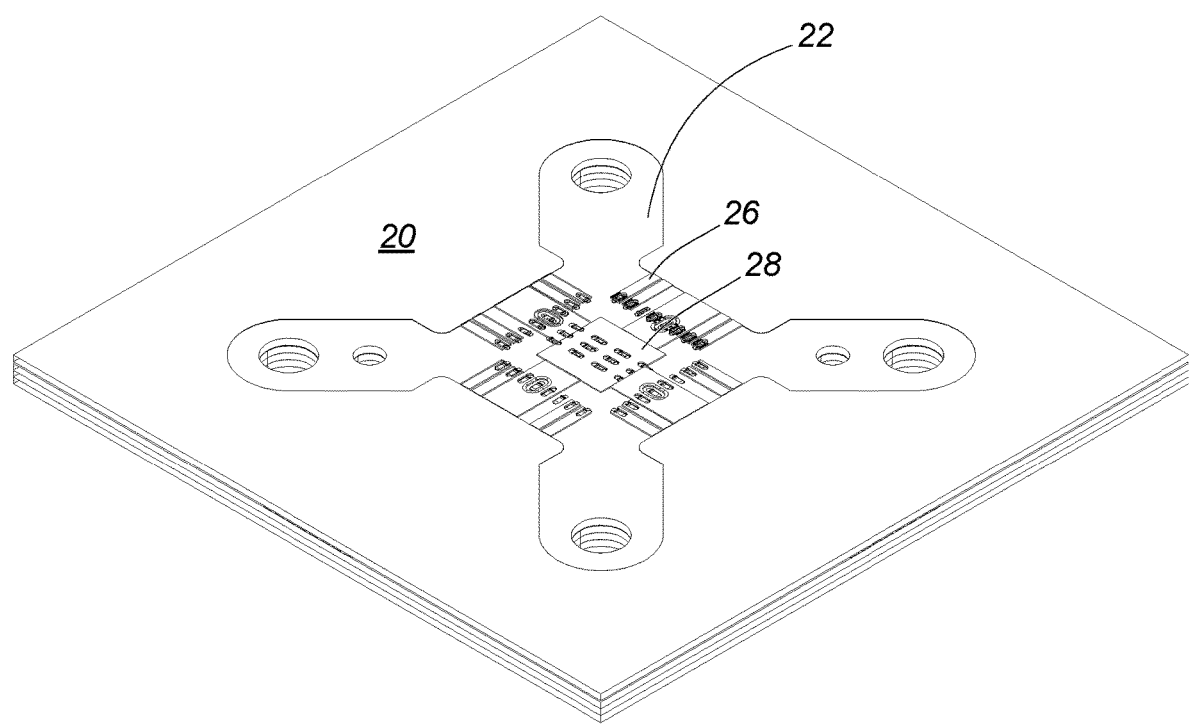
FIG. 1 is a top perspective view of part of a housing with the DUT removed embedded into a load board.

High frequency chips are harder to test because they need isolation between pins.

A unique solution to getting high frequency isolation is to make test housings out of high performance circuit boards. Machining circuit boards just like housing made from plastics using standard printed circuit board techniques to plate slots to enhance ground connections. Plating of slot walls with metal (with protective coating or just air spacing) provides a ground plan preventing cross talk and setting the desired impedance.

Also adding vias and traces to provide high isolation barriers between signals and to potentially route signals, power lines or even Kelvin connections to other places on top or bottom of housing to make test contactor match or control impedances or to interface with circuit board traces or pads to facilitate efficient I/O transfer. See attached FIGS. 14-17.

Another way to create isolation between signals is to build up vertical layers with thin layers of plating between machined slots to create isolation walls. Thickness of layers would correspond to device I/O pitches so machining could place slot features between copper planes. Laminated housing made out of many layers has the potential to be much stronger than other materials.

By using 10 mil thick circuit boards the housing can be the same size as the top layer of the board and using stripline (edge) connectors or milling to expose RF traces on the internal layer, the contactor can replace the board by cutting out a hole in the top layer of the board.

A solution to the problem of inductance and capacitance which become problematic at high frequencies, is to eliminate a separate housing and bring the DUT (device under test) as close to the load board as possible. By inserting contactor into the load board itself, with the contactor housing being made out of circuit board material the ground connections that normally done with vias will be replaced by contacts, inductance and capacitance is reduced. Using the same hard materials as load boards all the trace widths will be the same (board material change may result in trace widths changed to get 50 Ohms).

This system would truly make the socket or contactor electrically invisible and performance would be similar to solder to board connector, only connection in socket or contactor would be temporary, plus promoting production high volume testing, but getting data similar to if device was soldered to board. This type of small contactor would allow testing at frequencies above 40 GHz and with small contacts for 0.254 mm thick housing to match standard top layer substrate thickness could attain test frequencies above 80 GHz.

Metal on the top side and bottom side of the housing (contactor) that fits into a recess cut into the load board create ground plane, EMI shields and better matching. The recess is cut into several circuit board layers of the load board, which is multilayered. The recessed area allocated for the contactors has to be free of components and traces so that no circuits are disrupted. The bottom of the recessed area in the load board will have traces aligned to directly engage the contact pins bottoms. This eliminates substantial electrical distance between the DUT pads and the load board, thereby reducing the inductance and capacitance. The recess can be such that the upper surface of the contactor is substantially (though not exactly) flush with the load board, and only the alignment plate will extend substantially above the load board. Since the alignment plate contains no electrical components, it does not affect inductance and capacitance of the test system. The housing inserted into the board could also be made out of metal (copper, BeCu, aluminum, or gold plated) with non-conductive inserts that could house contacts and provide a coaxial connection with superb isolation between signals. This could potentially provide extremely low ground inductance, great thermal conductivity, and very high bandwidth with great isolation. Plus metal will add more strength to the contactor/housing and tend to bend less than a housing of the same thickness in plastic.

For isolation purposes metal housings provide great isolation, but without non-conductive material between I/O contact and housing the contact would short to ground. The contactor usually rests on top of board and is not normally embedded in the board. In this disclosure, the contactor may be embedded into the board.

Here are some of the advantages of this concept:
1. Ability to provide grounding in-between signal I/Os to improve isolation. 2. Ability to apply ground connection easily and provide multiple ground paths between device under test and load board to reduce ground inductance. 3. Ability to control or match impedances of device I/O. 4. Ability to siphon off sense signal from measuring force contact to provide Kelvin connections. 5. These Kelvin connections could be routed to connection interfaces to load board. 6. These Kelvin connections could be routed to connector attached to housing to allow Kelvin connections to route directly to tester without having to make costly routings on load board. 7. Shielding individual signals for EMI purposes. 8. To directly connect to device package ground providing a low inductance path simulating (solder down) as used by systems. 9. Incorporating decoupling devices such as capacitors directly into housing. 10. Incorporate matching components (inductors, capacitors, and resistors into housing. 11. Providing EMI shield of whole housing so multiple devices in close proximity can be tested simultaneously. 12. Less expensive material for housings can be used than normal test socket plastics today. 13. Technology can support any size of contactor even competing technologies such as cantilever or spring pin technologies. 14. Socket or contactor could be imbedded into circuit board and bottom of contacts could interface to ground plane directly lowering system test ground inductance. 15. Layered circuit boards with layers perpendicular to top of housing would create plywood effect and be very strong and lasting. 16. Copper layers between laminates can be centered between machined slots to create isolation barriers between signals carried on ROL contacts in the slots. 17. Substrate thicknesses can be the same as pitch of device I/O to center slot in between copper layers. The vertical layered approach would work well for two sided packages such as DFN and SOT packages. 18. Ideas 1-14 and 19 would allow processing like circuit board material after machining operation to create features for all packages. 19. Top side of housing can have traces that run close to front of slots so they could contact device pad or I/O in addition to contact in slot to create a Kelvin connection that could run to connector on housing so there is no need to wire or layout load board for Kelvin applications. It is possible to wire the cable assembly from contactor to tester directly making/adding Kelvin after the fact easy for both characterization and production testing. 20. Making contactor same thickness as layer or layers of circuit board would allow it to fit in cutout on board and essentially replace vias to ground plane only adding compliance making it easier to test devices. 21. Contacts in ground paddle area can replace board vias adding compliant. 22. Metal housing with non-conductive inserts would be able to provide very low inductance solution, high isolation, and better thermal capability. 23. Contacts would be small (standard board thickness for high frequency applications is 10 mils (0.254 mm) to provide a short path from RF lines embedded in board to pads were the test device will rest on load board. 24. Since housing could potentially be made from a circuit board it can be laid out like a board except for features needed to install contacts. 25. Housing could obtain DC power from traces to power up active circuitry to make contact smarter or add features such as jam checking, insertion counter, device in socket monitor, maintenance alert, Cres monitor, etc.

Broadly speaking, it is possible to build a housing/contactor directly embedded in the board to provide higher frequency testing capability and potentially add smart technology to contactor concept.

FIG. 1 illustrates a load board 20 with multiple circuit board layers and in which a contactor/housing 22 is recessed into at least some of the layers of the load board 20. Load boards are typically multilayer and typically constructed to provide pads when a housing would be situated directly thereon. This has been the norm for years, but this has a drawback since the chips which have high frequency (RF) terminals will suffer degradation of their signals due to capacitance and inductance introduced by the housing itself.

In this embodiment, the housing/contactor (i.e. that portion which holds the pins for receiving a DUT) passes signals to the load board is cut into/recesses into the load board itself so that it has effectively zero inductance and capacitance. The contactor 22 has traces 26 which lead to a DUT (device under test) receiving area 28.

Figure 2:
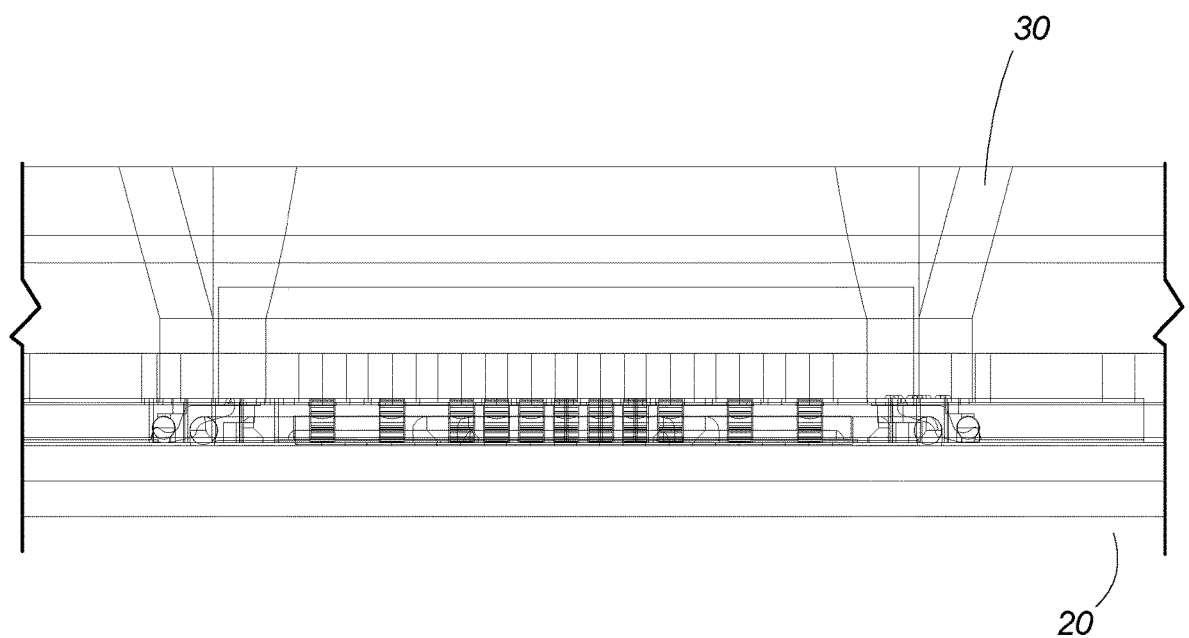
FIG. 2 side sectional view of FIG. 1.
Figure 3:
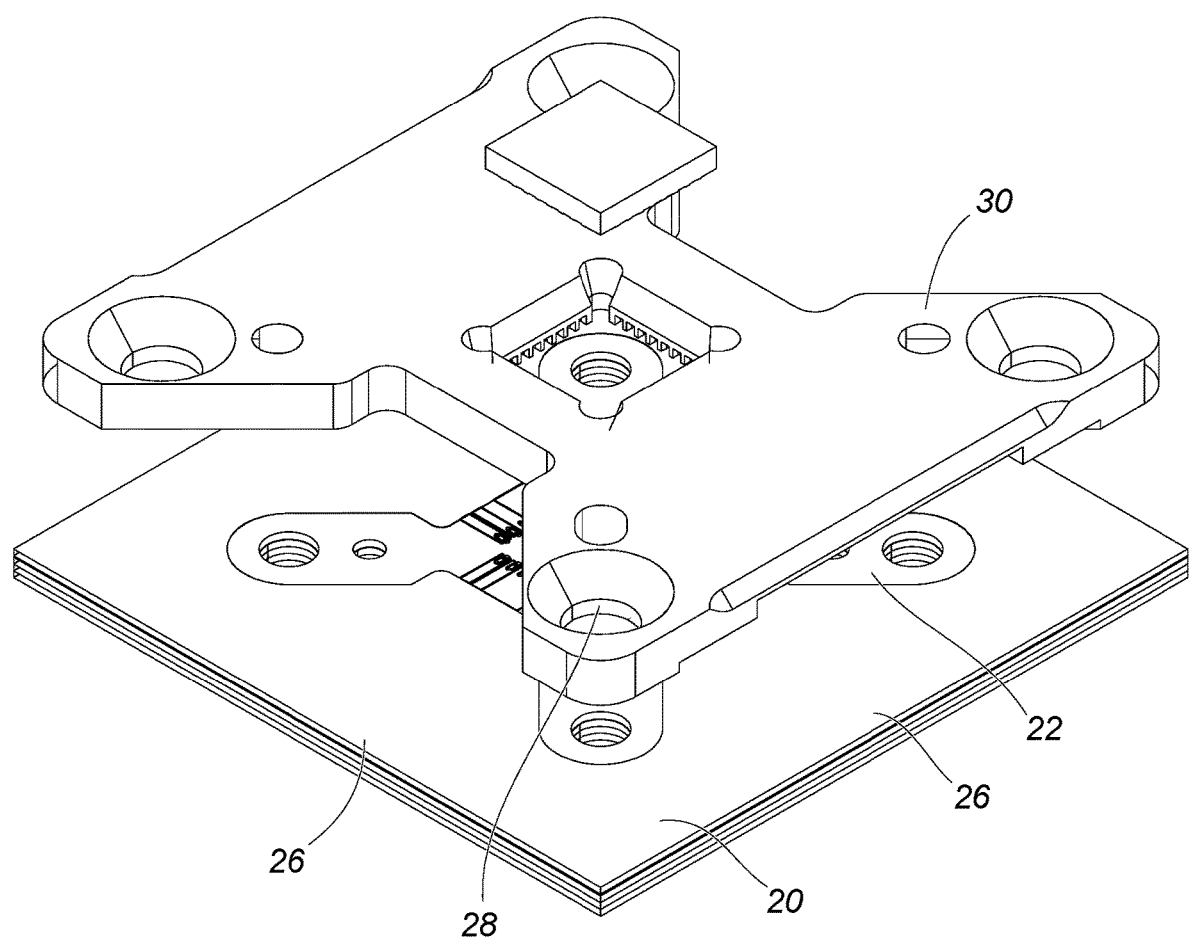
FIG. 3 is an exploded view like FIG. 1 but including a transparent representation of an alignment plate atop the housing for locating the DUT.

FIG. 2 is side sectional view of FIG. 1 with an alignment plate 30 and FIG. 3 is an exploded view thereof.

Figure 4:
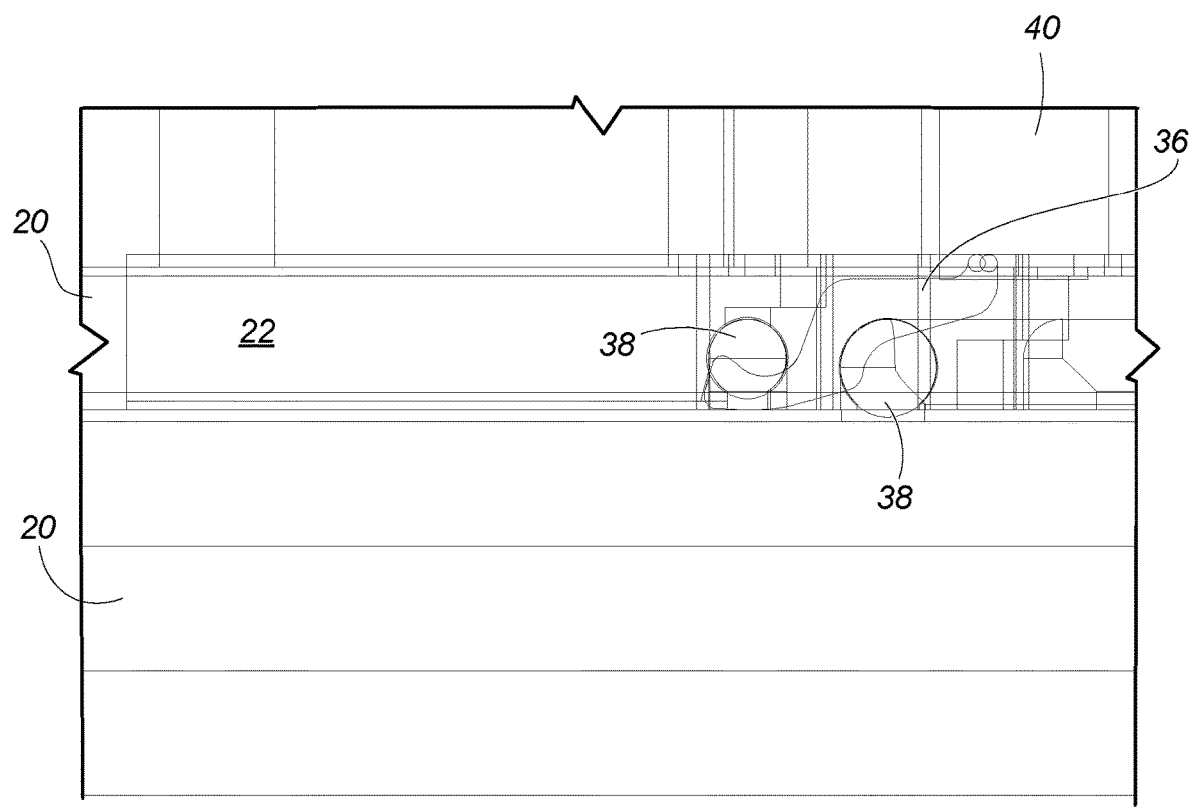
FIG. 4 is a side sectional transparent representation of one pin engaging a DUT.

FIG. 4 shows an enlarged view of a pin 36 with elastomers 38 made generally of a known art, where 40 is a portion of the DUT. Notice that some or all of the housing/contactor is recessed into the load board 20.

Figure 5:
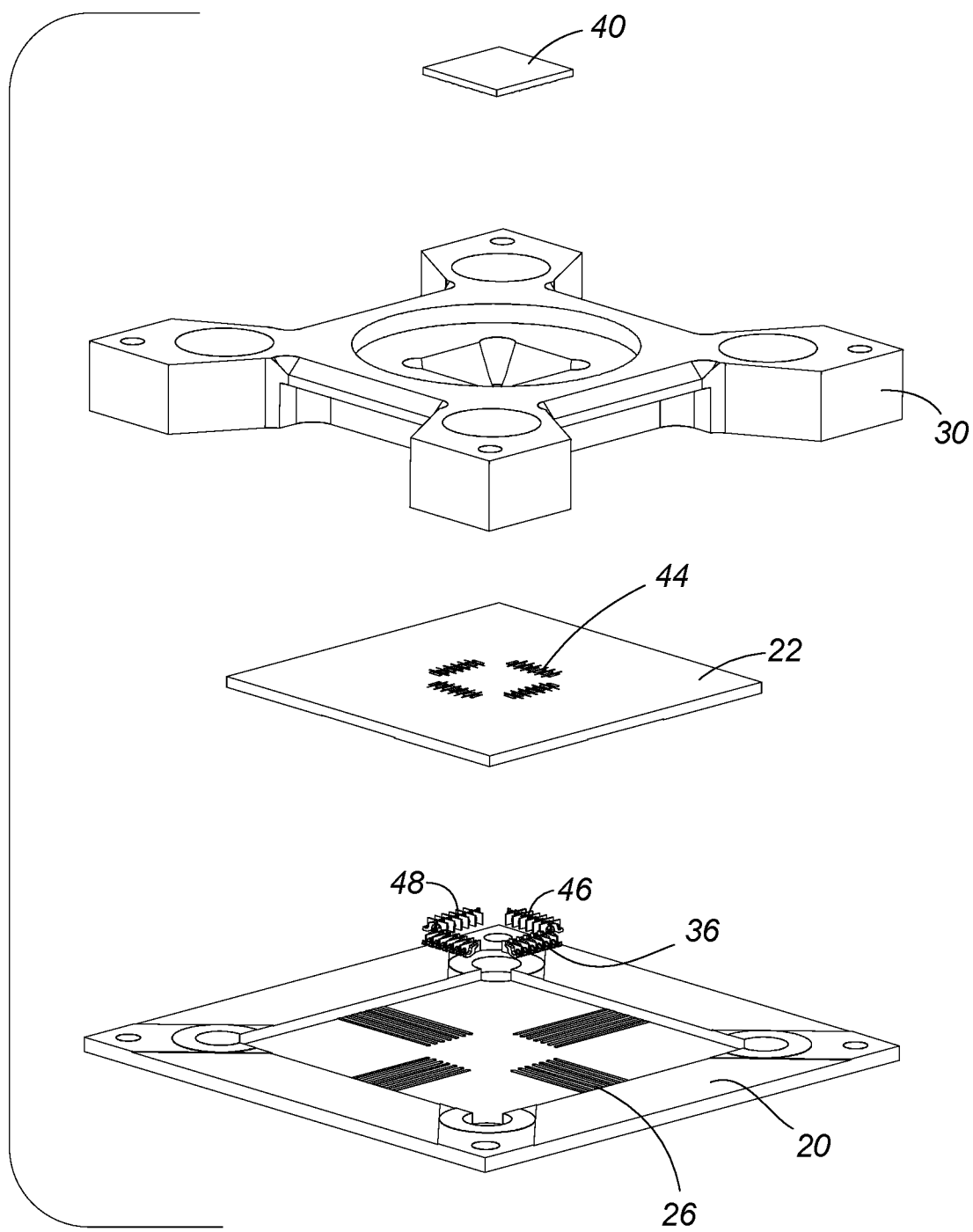
FIG. 5 is an exploded view like FIG. 2.
Figure 6:
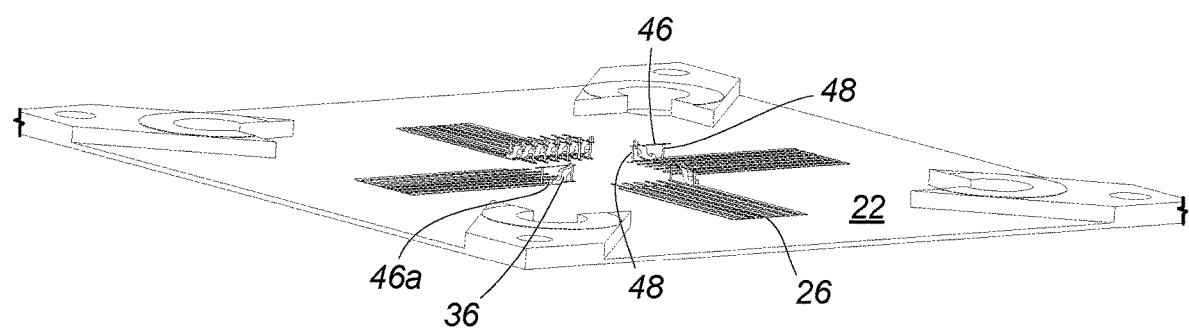
FIG. 6 is fragmentary perspective view of the inset contactor.

FIGS. 5 and 6 show a housing 22 with slots 44 sized to receive pins 36. Also shown are metallic plates or conductive/metalize plating 46 (46a may be designed as the bottom) and electrically connecting paths or vias 48. These are shown in greater detail in the following figures.

In addition to reducing inductance and capacitance by sinking the contactor/housing directly in to the load board, there is another way to further reduce degradation of RF/Hi-Freq signal losses of such RF pins. By creating a ground plane around such RF pins, the signal loss and crosstalk can be greatly reduced. This ground caging or isolating concept can be employed with the above direct integration of the contactor into the load board, or it can be used separately. There are two independent concepts, which together provide better performance. For example, the ground caging concept can be used with housings/contactors which are placed atop the load board in the traditional way.

Figure 7:
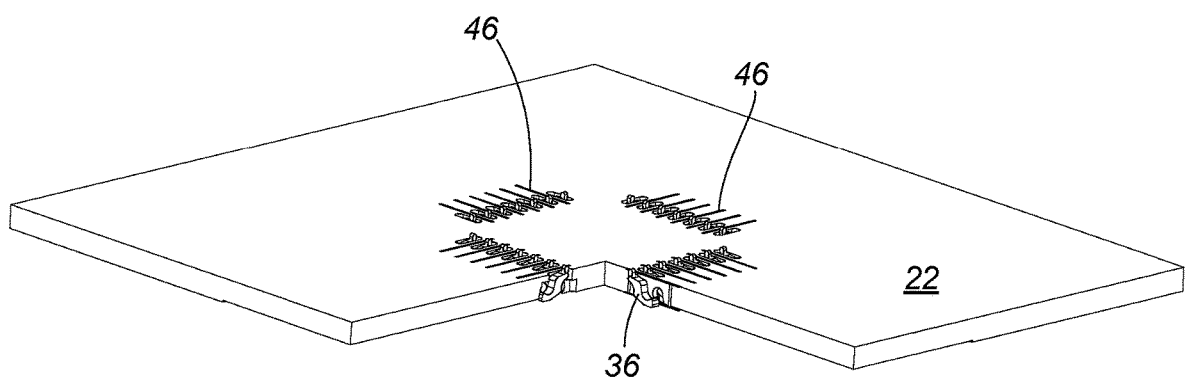
FIG. 7 is a perspective view of the inset contactor with portions broken away to expose contact pins, shielding and vias.
Figure 8:
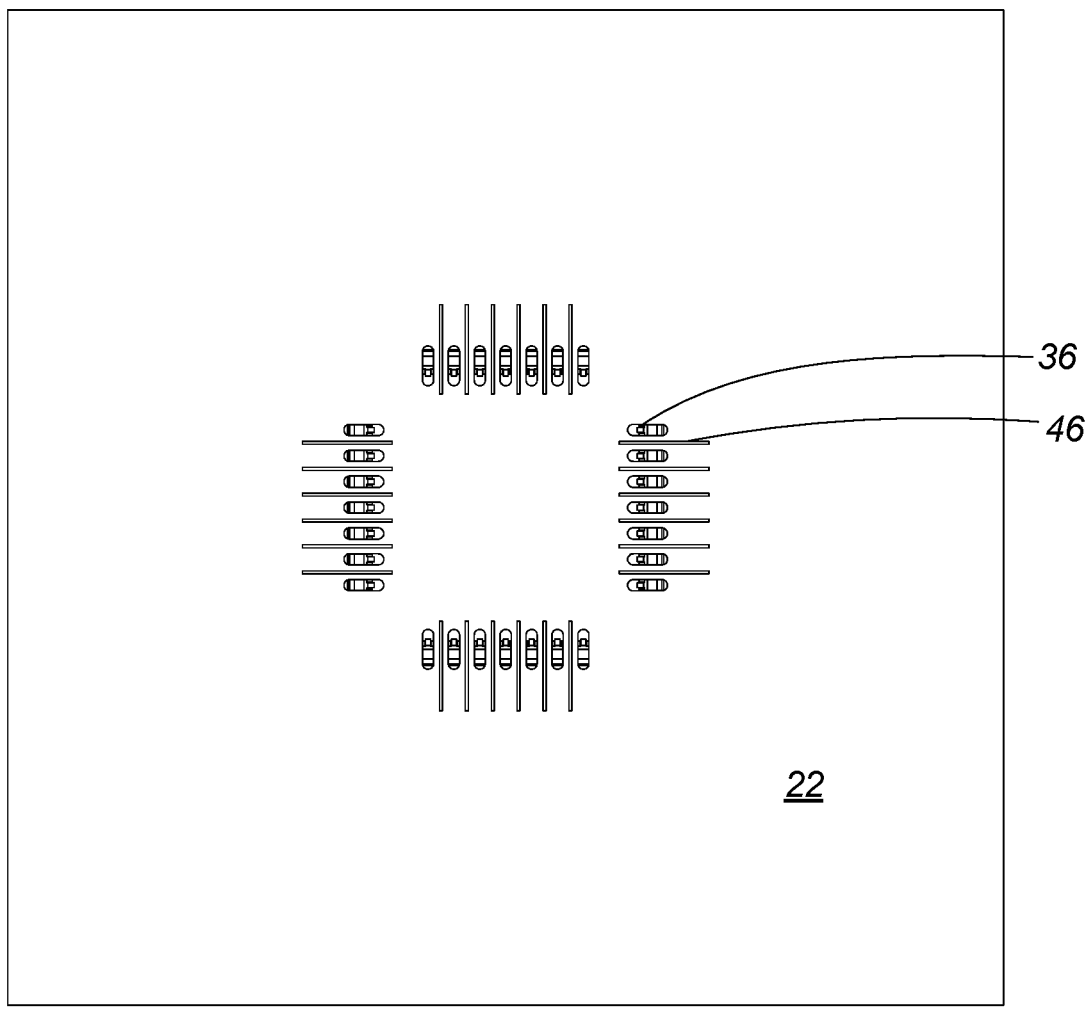
FIG. 8 is a top plan view of FIG. 7, without portions broken away.
Figure 9:
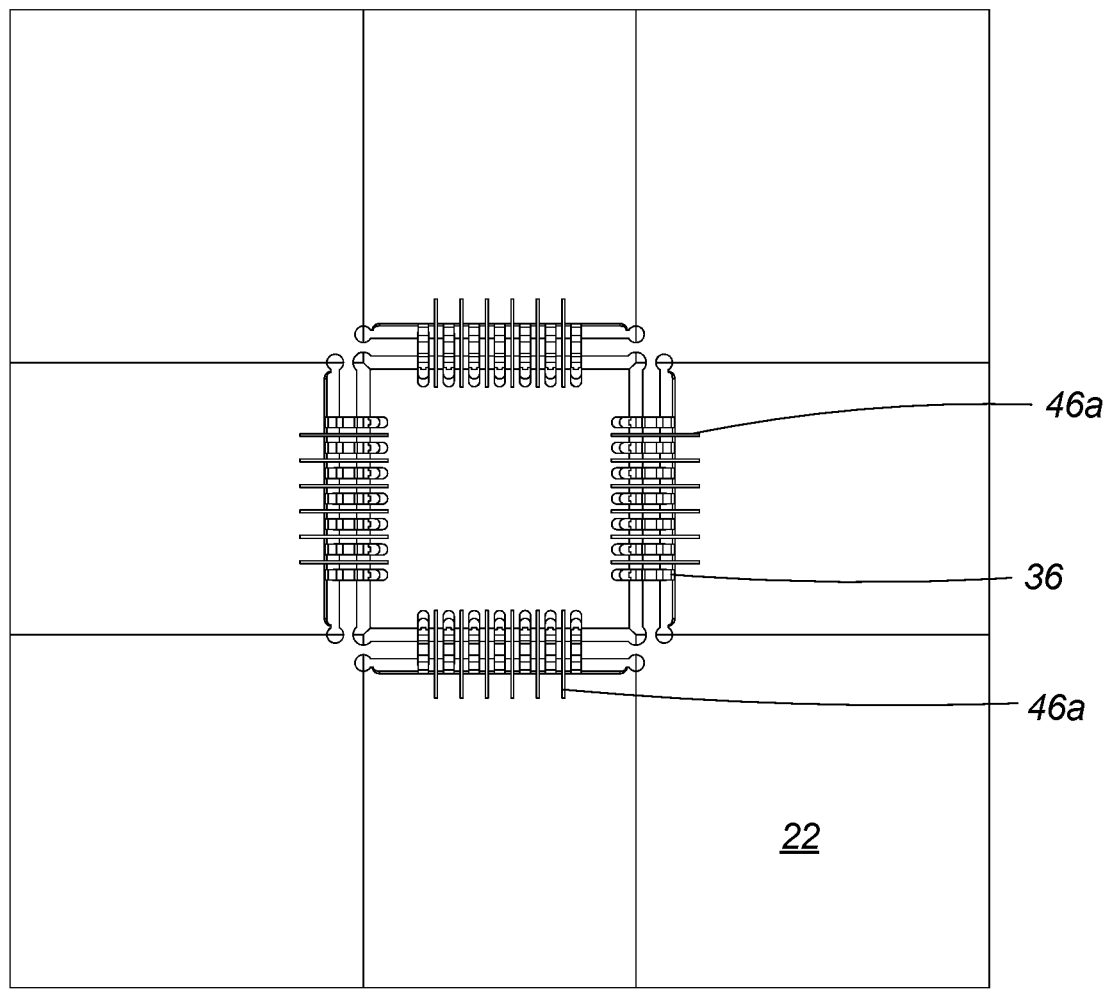
FIG. 9 is a bottom plan view of FIG. 8.

FIG. 7 shows a portion of the contactor 22 cut away and plating lines 46 are visible. FIG. 8 is a top view showing the metalized lines 46. FIG. 9 is a bottom view which shows the bottom set of metalized lines 46, which would be connected to a ground source on the load board.

Figure 10:
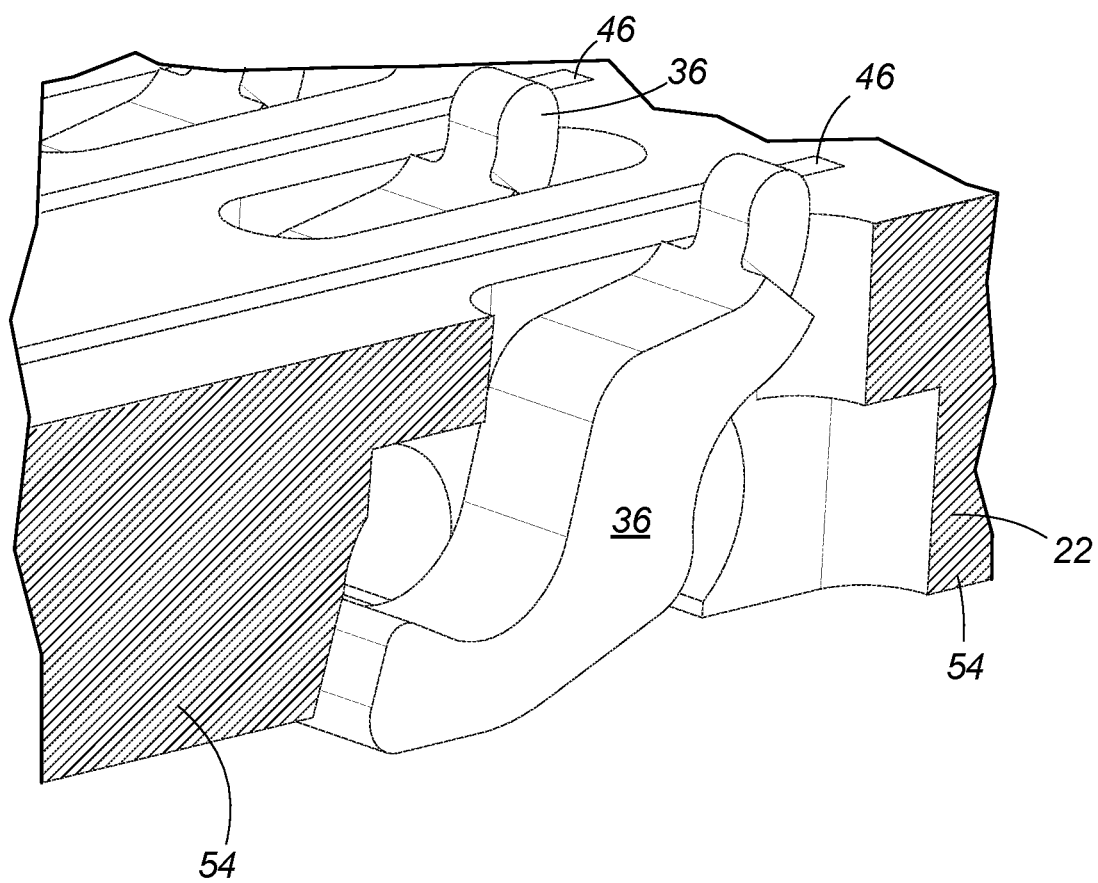
FIG. 10 is an enlarged side perspective view of a pin.

FIG. 10 is a close up fragmentary view of a pine 36 being framed in by metalized layers 46 on top. In addition, the walls of the contactor can have a metalized coating 54.

Figure 11:
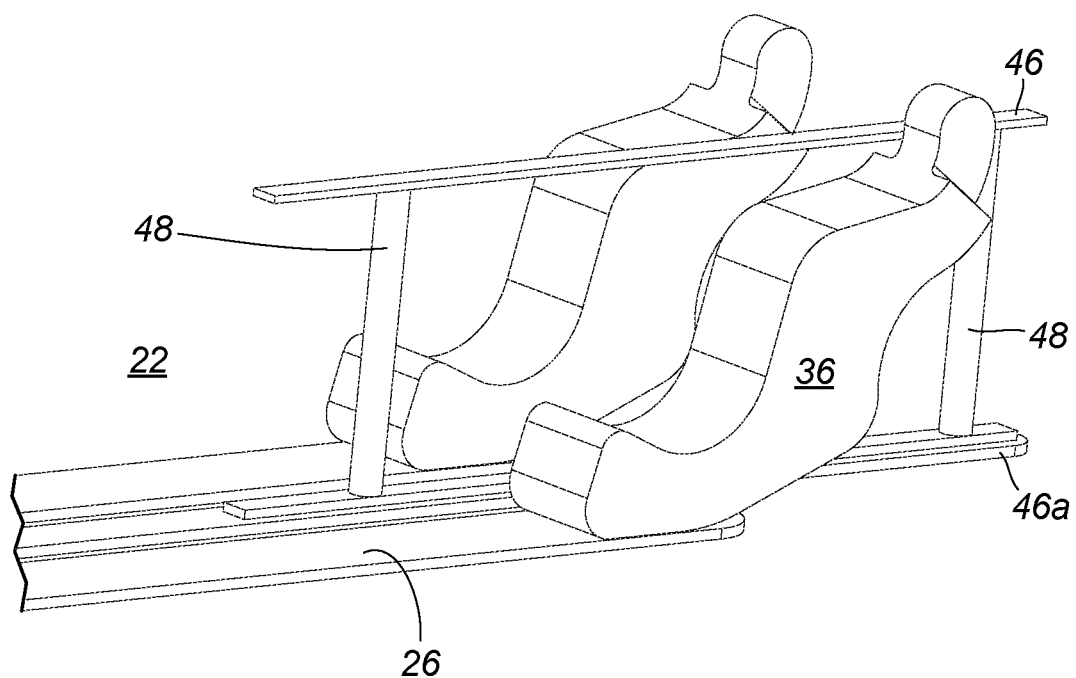
FIG. 11 is a view like FIG. 10 except with the housing/contactor removed to show the ground plating and vias.

FIG. 11 illustrates one ground caging structure. In this embodiment, a ground cage is created by locating a metalized deposition/traces/wires between pins, on the top and bottom surfaces of the contactor 22. The stripline traces are connected to each other by vias 48 which are spaced apart.

FIGS. 11, 12, 13 and 14 illustrate the ground framing around contact pin 36. While any pin can be ground isolated, generally only pins which carry high frequency signals are the best candidates. In this embodiment, a pair of metallic walls are created on either side of the pin. Metallic traces, either by deposition or made of discrete metal, are applied to the top and bottom surfaces of the contactor between on both sides of the pin, but spaced therefrom. The bottom trace is situated on or in the load board atop a ground connection trace in the load board. The top trace is connected to the bottom trace by vias or electrical connecting lines 48 which extend through apertures in the contactor. The spacing of the apertures/vias may be determined by practical considerations (how much space is available) or by the signal frequency, based on the principles of a Faraday cage, where the spacing between vias is small enough that signals cannot penetrate.

An alternate embodiment is shown in FIGS. 16, 17, 18, 19, 20, 21, 22, and 23. Like in the previous embodiment, there is a top and bottom trace/metalized area and vias, but instead of the top trace being longitudinal and generally straight, it follows the circumferential opening.

A coaxial ring trace/metalize layer surrounds the pin opening/well 50 to create a complete circumference. The bottom trace can be circumferential as well or merely linear as in the previous embodiment. If the bottom trace 46a is coaxial, it will be displaced longitudinally slightly off the center of the upper coaxial ring since, in this embodiment the pin 36 has an upper contact which engages the DUT, is off the center of the lower contact which engages the load board. In another embodiment, the well has interior walls which themselves are metalized. This can eliminate or supplement the use of vias as the interior walls of the well will be electrically joined to the upper and lower traces creating a complete RF barrier. On top of the plated interior walls, the surfaces can also include a non-conductive deposition coating/sleeve to prevent any possibility of a short between the pin and the walls. Of course, there is a gap between the well and the pin, so the risk of shorting is small.

Figure 12:
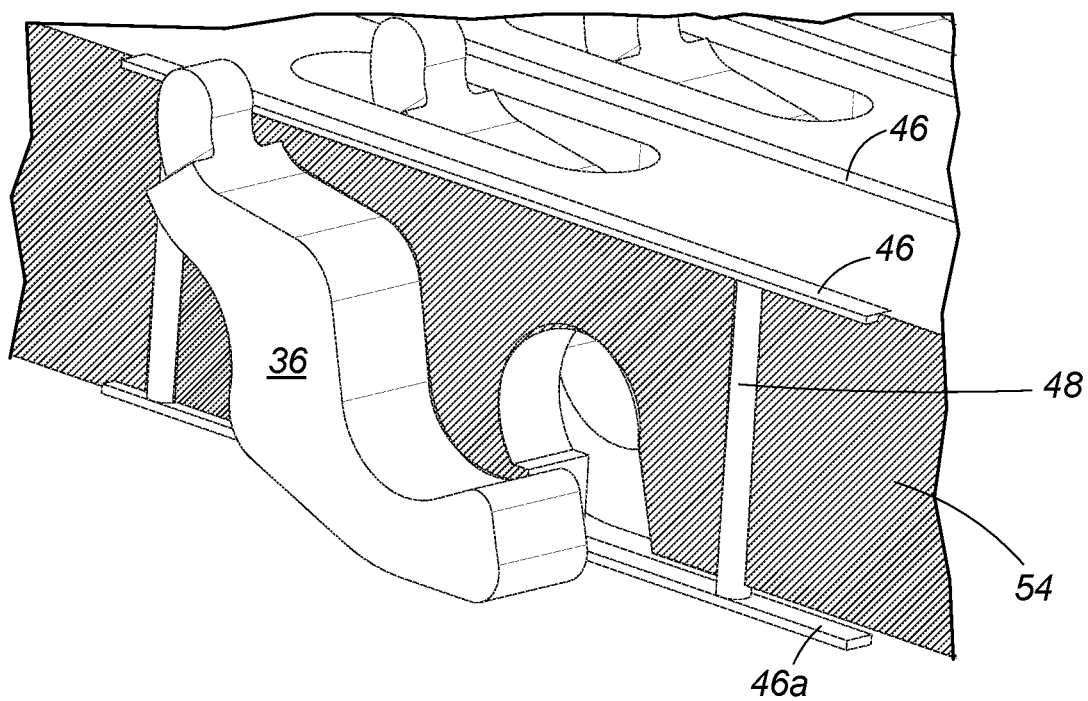
FIG. 12 is a sectional perspective view like FIG. 11 with the housing walls shown.
Figure 13:
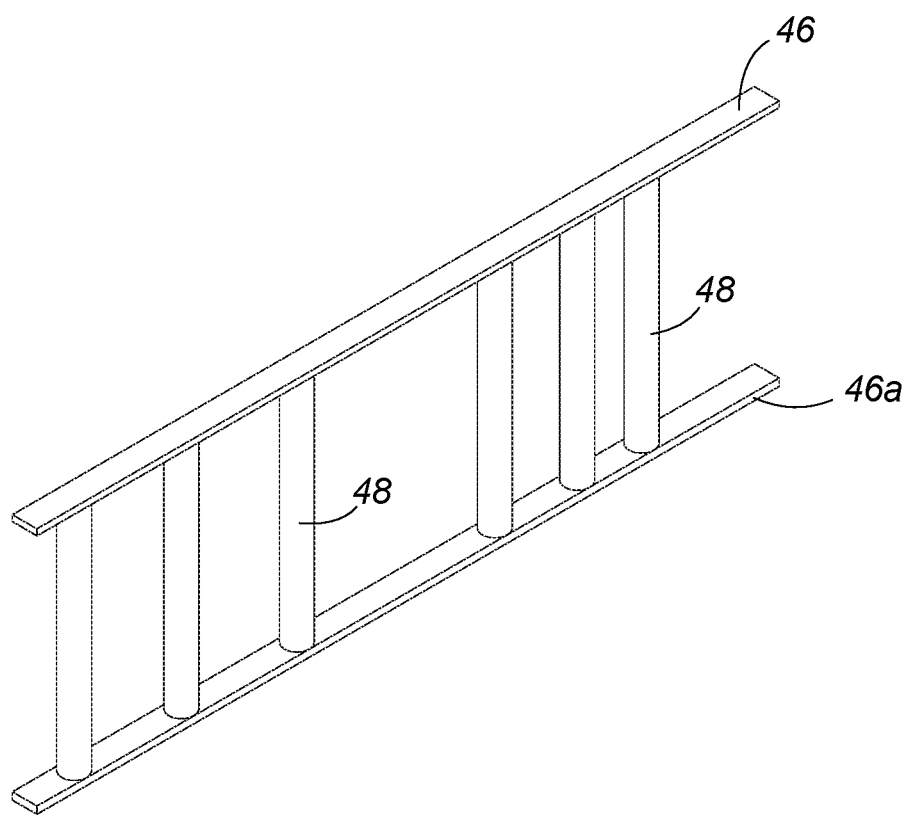
FIG. 13 is a perspective view of the ground insulator shown in FIG. 12.
Figure 14:
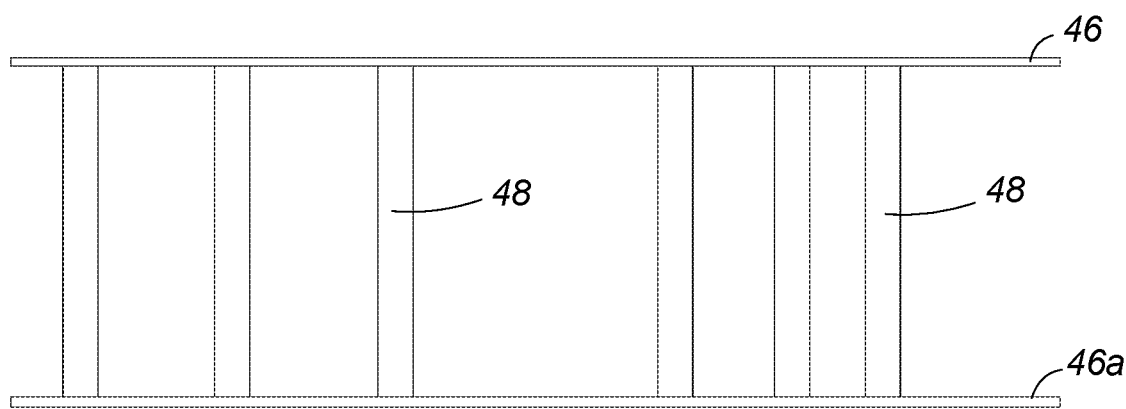
FIG. 14 is a side plan view of FIG. 13.
Figure 15:
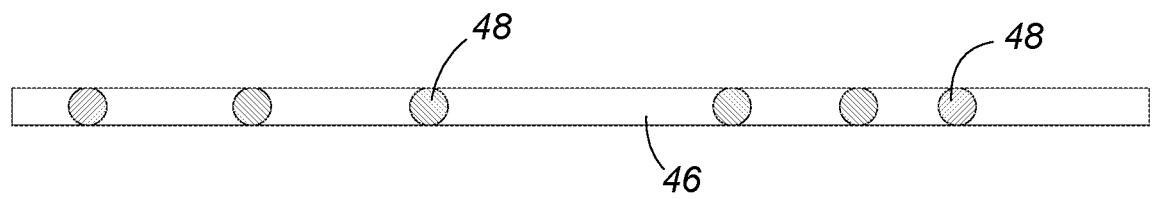
FIG. 15 is a top plan view of FIG. 14.

FIG. 12 illustrates an alternative use of the upper trace 46. Instead of being directly connected to a ground, the lower/bottom trace 46a can be connected to a testing line as part of a Kelvin test. Pin 36 would then form the force or current carrying contact while upper trace 46 would also align with the pad/ball on the DUT and form the sense contact in a Kelvin test configuration. Since there may be two traces 46, one on either side of the moving pin 36, they can both be connected as sense Kelvin test lines so that at least one of them will engage the DUT.

Figure 16:
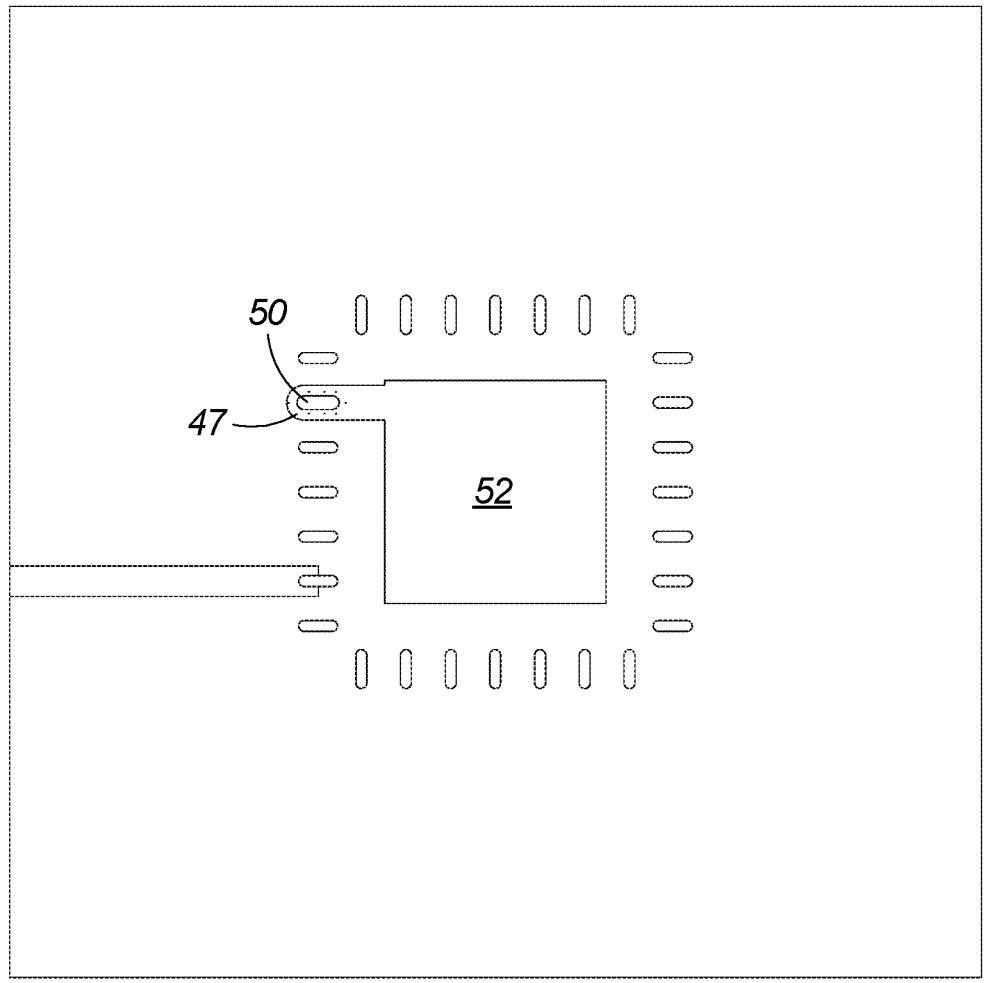
FIG. 16 is a top plan view of an alternate embodiment of the ground isolation system.
Figure 17:
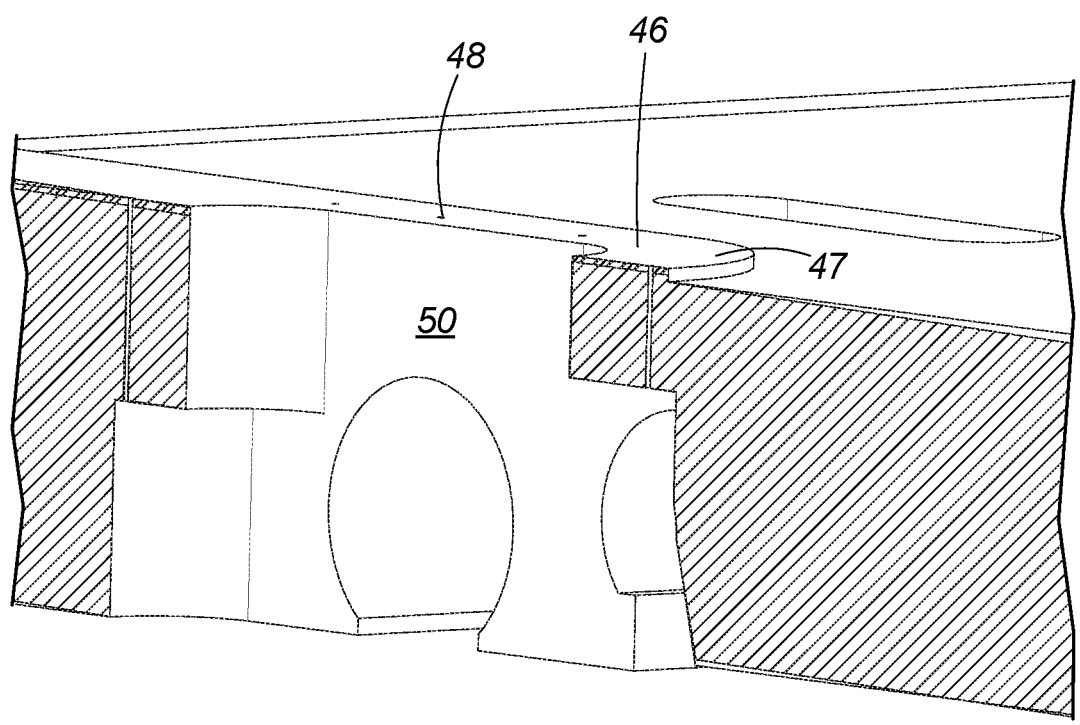
FIG. 17 is a side perspective view of one pin slot with metalized isolation barrier walls.
Figure 18:
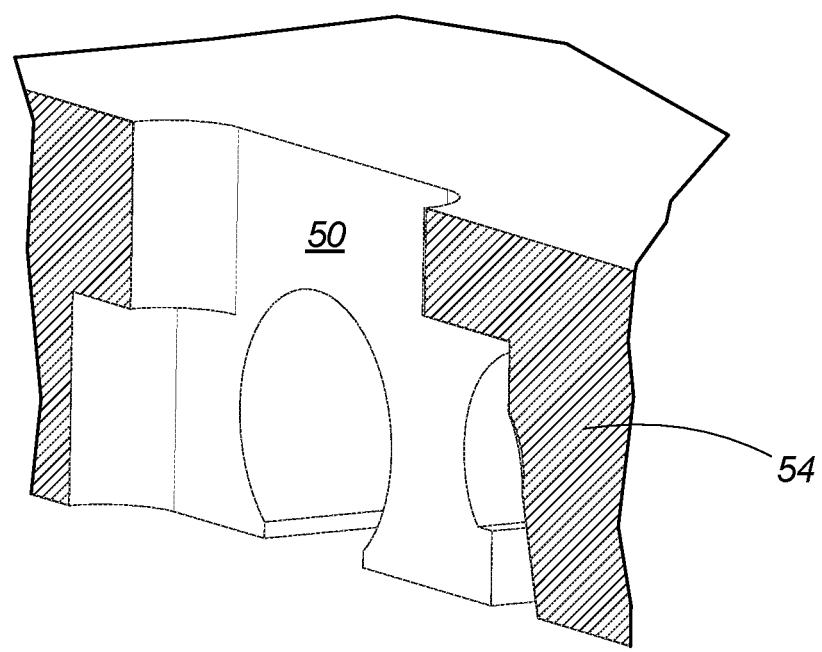
FIG. 18 is similar to FIG. 17 except with a metalized circumferential ring removed.
Figure 19:
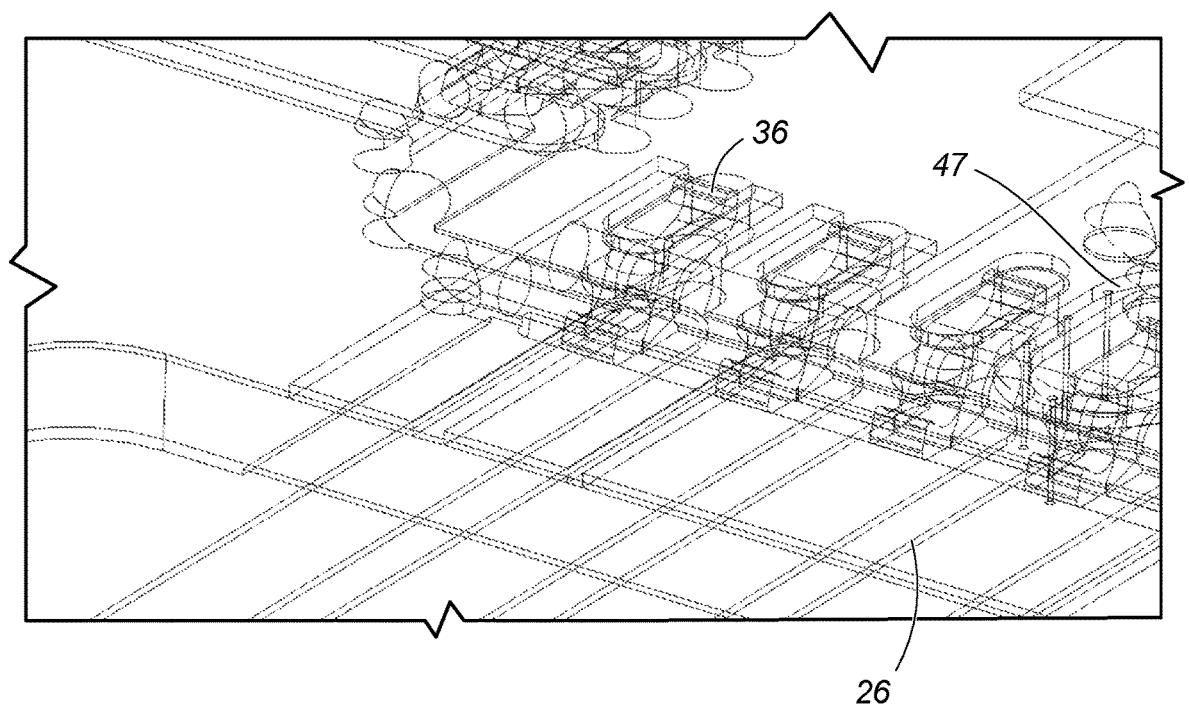
FIG. 19 is a top perspective transparent view of an isolation barrier embodiment.
Figure 20:
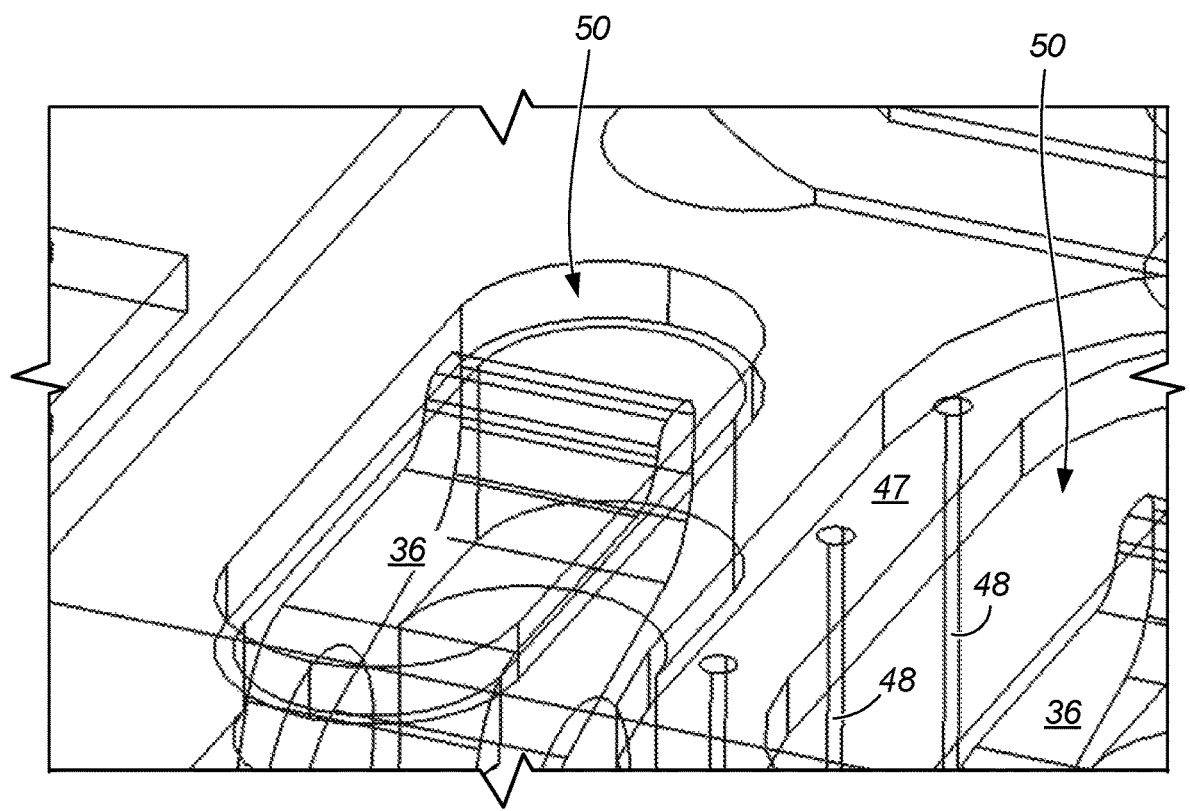
FIG. 20 is a close up perspective transparent view of a portion of FIG. 19.
Figure 21:
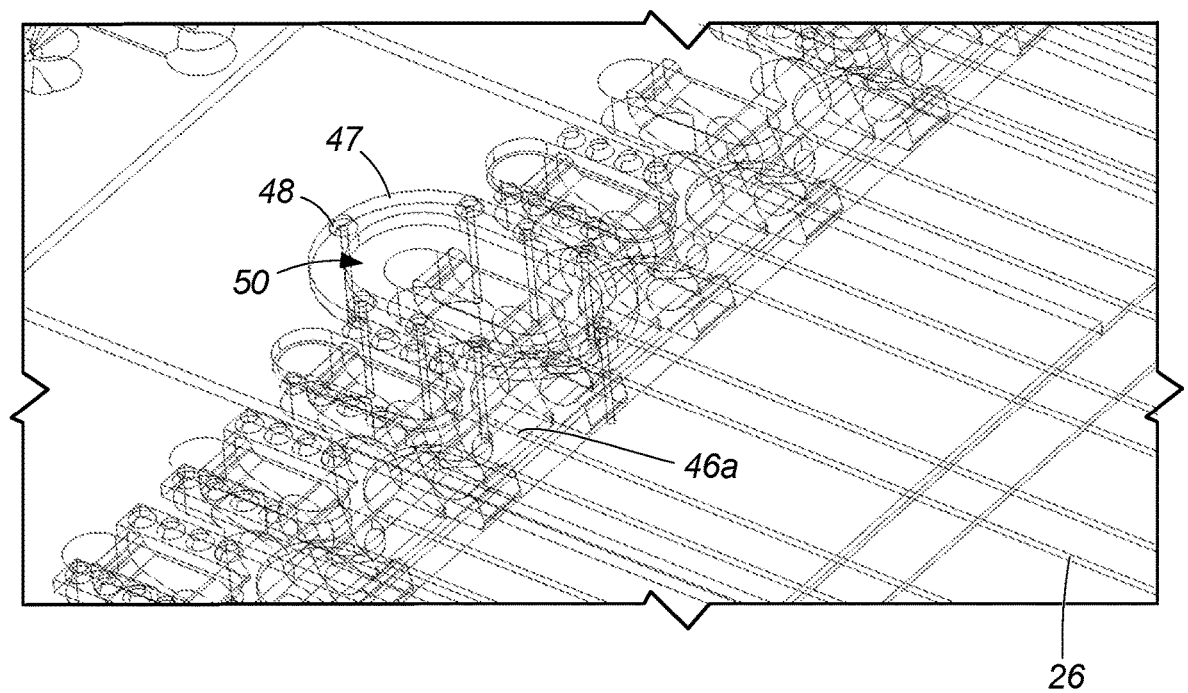
FIG. 21 is a close up perspective transparent view like FIG. 20 but an alternative embodiment.
Figure 22:
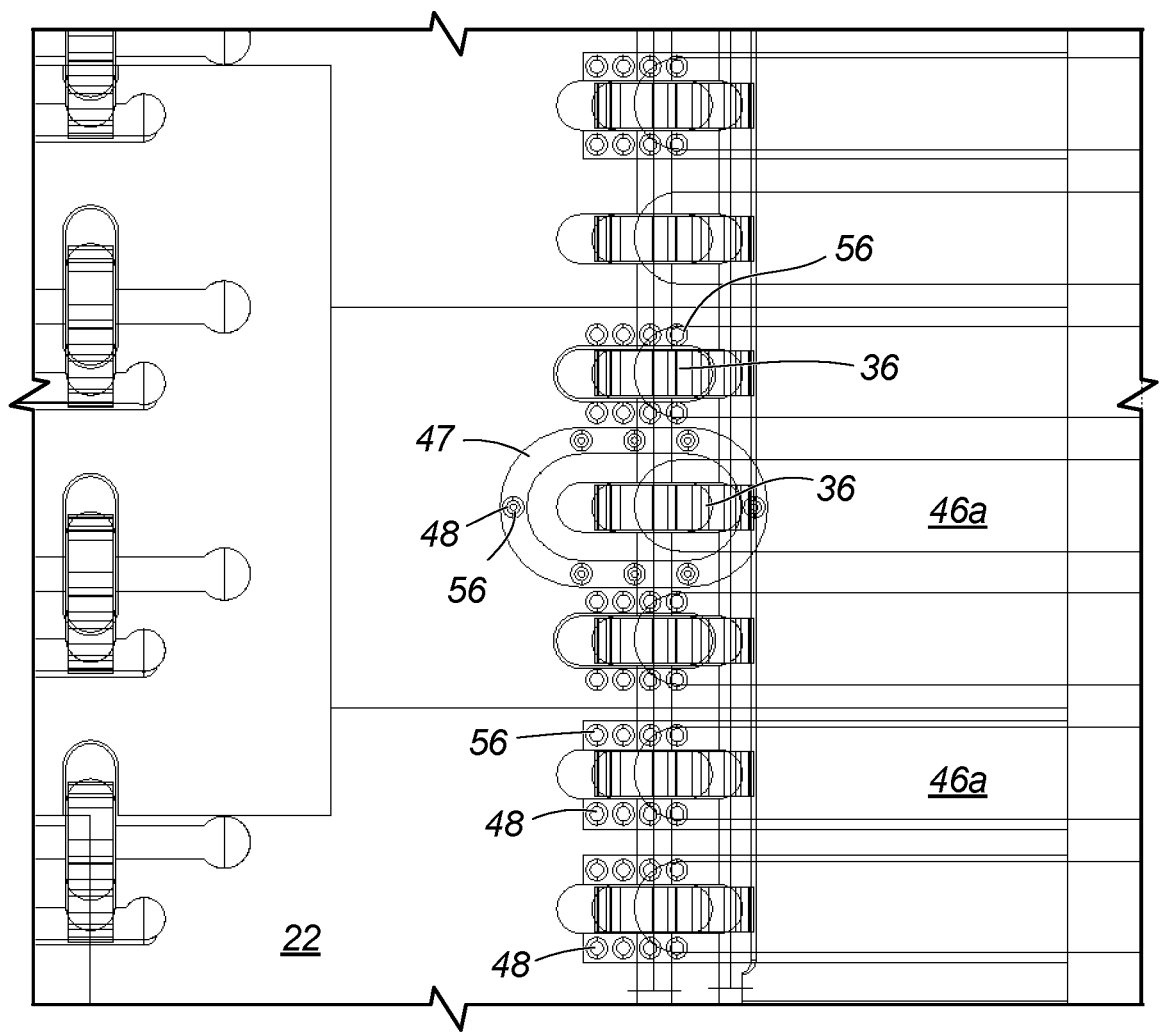
FIG. 22 is a top plan view of the subject matter of FIG. 21.
Figure 23:
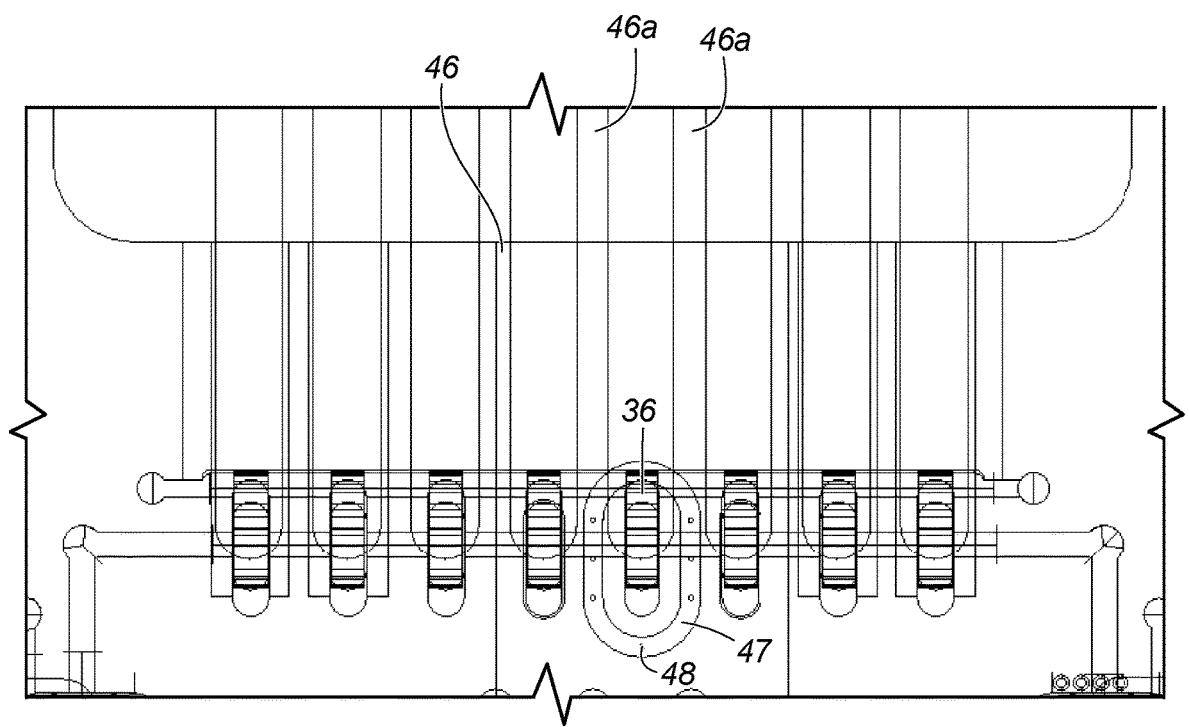
FIG. 23 is a top plan view similar to FIG. 22.

FIG. 16 illustrates a ground plane which has an extension to a pin opening 50 and a circumferential metal ring 47, which is connected by vias 46 to a ground trace on the other side of the contactor.

In order to provide additional compliance/resilience when a DUT is inserted into the alignment plate and hence the contactor, silicon based elastomer micro-pins can be affixed around the periphery of ring 47. An example of such a resilient pin is made by Invisipin, R&D Connect, Allentown, Pa. (www.rdis.com) which has solderable resilient micro-pins intended for other purposes.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

We claim:

1. A method of constructing an integrated multilayer load board and test contactor for testing an integrated circuit device under test (DUT) in order to minimize inductance and capacitance of signals from the DUT comprising:
   a. providing a low profile contactor for holding a plurality of contact pins having an upper end to be aligned with said DUT and a lower end to engage electrical traces on said load board, said contactor having a bottom surface;
   b. providing an area of the load board where in a plurality of upper layers are free of components and electrical traces;
   c. in said area, cutting a recess into a plurality but not all layers of the load board to expose a recess load board layer, the recess being sized to receive a contactor housing therein, said recess sized to receive at least a portion of the bottom surface of the contactor;

d. extending electrical traces onto said recess layer in the area defined by said recess; said traces being aligned to contact said lower ends of said pins;

so that signals from the DUT travel through the pins and directly to said load board without intermediary pathways thereby minimizing inductance and capacitance.

2. A radio frequency (RF) isolating structure for use in an integrated circuit tester to be mounted on a load board for testing, comprising:
   a. a contactor housing having upper and lower surfaces and at least one slot of predetermined length; the slot having sidewalls on either side of the slot;
   b. a contact pin which moveably extends though the slot with an upper end of the pin configured to engage an integrated circuit device under test (DUT) and a lower end to engage said load board;
   c. adjacent both sidewalls, an electrical pathway extending at least the length of the slot but spaced therefrom located on both said upper and lower surfaces;
   d. at least one electrical via connector joining said pathway on the upper surface to the lower surface, and wherein said at least one via includes an elastomeric resilient pin, thereby creating compliant resilient isolation fence which can be connected to a ground source and is compliant in response to the insertion of an integrated circuit into the contactor housing.

3. The isolating structure of claim 2 wherein said electrical via are traces are depositions onto said contactor housing surface.

4. The isolating structure of claim 2 wherein said via connector includes a plurality of spaced apart connectors.

5. The isolating structure of claim 4 where the spacing of the said spaced apart connectors is configured to create a Faraday cage shield.

6. The isolation structure of claim 2 wherein said connector includes a solid wall span of metallic curtain connecting substantially the length of the slot from upper to lower surfaces.

7. The isolation structure of claim 2 wherein said electrical pathways include a conducting ring adjacent to and surrounding said slot on the upper surface.

8. The isolation structure of claim 2 wherein said electrical pathways include a conducting ring adjacent to and surrounding said slot on the upper and lower surfaces and wherein said at least one via connector includes a plurality of via connectors spaced apart and joining said upper and lower surfaces to create a RF isolation of the slot.

9. The isolation structure of claim 2 wherein said slot includes inner sidewalls and where said sidewalls are electrically conductive and grounded.

10. The isolation structure of claim 9 wherein said electrically conducted sidewalls are covered with a non-conductive material.

11. The isolation structure of claim 2 wherein said electrical pathways on said upper surface are configured to be part of a Kelvin test system with said pathways being a sense test contact and wherein said contact pin is configured to be a force test contact.

* * * * *